United States Patent
Simonazzi

(10) Patent No.: US 11,877,415 B2
(45) Date of Patent: Jan. 16, 2024

(54) BATTERY CHARGER FOR ELECTRIC OR HYBRID MOTOR VEHICLES

(71) Applicant: META SYSTEM S.p.A., Reggio Emilia (IT)

(72) Inventor: Giuseppe Simonazzi, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 500 days.

(21) Appl. No.: 17/261,805

(22) PCT Filed: Jul. 10, 2019

(86) PCT No.: PCT/IB2019/055884
§ 371 (c)(1),
(2) Date: Jan. 20, 2021

(87) PCT Pub. No.: WO2020/016707
PCT Pub. Date: Jan. 23, 2020

(65) Prior Publication Data
US 2021/0282289 A1    Sep. 9, 2021

(30) Foreign Application Priority Data

Jul. 20, 2018   (IT) .................. 102018000007394

(51) Int. Cl.
*H05K 7/14*    (2006.01)
*B60L 53/22*   (2019.01)
(Continued)

(52) U.S. Cl.
CPC ............ *H05K 7/1432* (2013.01); *B60L 53/14* (2019.02); *B60L 53/22* (2019.02); *H05K 5/0213* (2013.01)

(58) Field of Classification Search
CPC ...... H05K 7/14; H05K 7/1432; H05K 5/0213; B60L 53/14; B60L 53/22
(Continued)

(56) References Cited

U.S. PATENT DOCUMENTS

| | | | |
|---|---|---|---|
| 8,780,566 B2 | 7/2014 | Stengel et al. | |
| 2003/0151893 A1* | 8/2003 | Meyer | H02M 7/003 361/689 |

(Continued)

FOREIGN PATENT DOCUMENTS

| | | |
|---|---|---|
| CN | 206598716 U | 10/2017 |
| DE | 10 2015 208968 A1 | 11/2015 |

(Continued)

*Primary Examiner* — Tremesha S Willis
(74) *Attorney, Agent, or Firm* — ASLAN LAW, P.C.

(57) ABSTRACT

A battery charger for electric or hybrid motor vehicles having one container body installable on a motor vehicle and defining one housing compartment, one electronic appliance housed inside the housing compartment, connectable to one electric battery of the motor vehicle and configured to recharge the battery, one closing body of the container body associated in a removable manner with the latter to close the housing compartment, and the closing body being adapted to protect the electronic appliance housed inside the housing compartment whereby the closing body includes a reinforcing device/structure/component which are shaped and arranged so as to prevent the deformation of the closing body itself.

9 Claims, 1 Drawing Sheet

(51) Int. Cl.
*B60L 53/14* (2019.01)
*H05K 5/02* (2006.01)
(58) Field of Classification Search
USPC .......................................................... 174/50
See application file for complete search history.

(56) References Cited

U.S. PATENT DOCUMENTS

2007/0230137 A1 10/2007 Inagaki
2011/0240361 A1 10/2011 Bardia et al.

FOREIGN PATENT DOCUMENTS

| | | |
|---|---|---|
| EP | 2 876 984 A2 | 5/2015 |
| EP | 2 983 260 A1 | 2/2016 |
| JP | 2010 052701 A | 3/2010 |
| WO | WO 2013/046261 A1 | 4/2013 |

\* cited by examiner

BATTERY CHARGER FOR ELECTRIC OR HYBRID MOTOR VEHICLES

CROSS-REFERENCE TO RELATED APPLICATIONS

This application is a National Stage Entry of PCT/IB2019/055884 filed on Jul. 10, 2019. This application claims priority to IT Patent Application No. 102018000007394 filed on Jul. 20, 2018, and to PCT Application No. PCT/IB2019/055884 filed on Jul. 10, 2019, the entire contents of which are hereby incorporated by reference.

TECHNICAL FIELD

The present invention relates to a battery charger for electric or hybrid motor vehicles.

BACKGROUND ART

A number of battery chargers for electric or hybrid motor vehicles are known which are used to charge the electrical batteries generally fitted to such motor vehicles in order to power various electronic devices, such as e.g. the engine, the control unit, the lights and the like.

In particular, the battery chargers of this type are provided with an electronic appliance for the recharge of the batteries, and with containment means of the electronic appliance itself which aim to protect and facilitate the installation of the latter inside the motor vehicle.

Generally, the containment means define a housing compartment for the electronic appliance, and are provided with a plurality of connectors for the access to this housing compartment, so as to operationally connect the electronic appliance to the battery and/or to other electronic components, such as e.g. control cards, sensors and the like.

In particular, the containment means of known type are generally provided with two half-shells which can be coupled to one another and defining two half chambers respectively, which, when the two half shells are coupled together, define the housing compartment of the electronic appliance.

Advantageously, the two half shells are typically made of metal, which must be processed by means of die-casting processes that allow defining the shape of the two half shells and creating particularly durable and resistant containment means.

However, the die-casting processes used to make this type of containment means are generally expensive and produce extremely heavy and bulky half shells, thus negatively affecting the cost and performance of the motor vehicle.

To overcome the above mentioned problems, it is increasingly common to produce battery chargers comprising containment means provided with a container body defining the housing compartment of the electronic appliance and with a corresponding closing body associable in a removable manner with the container body to close the housing compartment and thus protect the electronic appliance.

In particular, the closing body is made substantially flat and does not require expensive die-casting processes for its manufacturing, making the containment means significantly cheaper and lighter than the containment means described above.

Even the containment means of this type, however, are subject to improvements related to their strength and durability.

In fact, the battery charger is generally subjected to continuous stress, such as e.g. of the mechanical and/or thermal type, which is mainly caused by the operation of the motor vehicle and which particularly affects the closing body, which, given its plate shape, is frequently subjected to particularly significant deformations over time.

Such deformations in fact compromise the conformation of the closing body that consequently does not perfectly seal the housing compartment, exposing the electronic appliance to serious risks and potentially causing serious damage to the motor vehicle.

In addition, it is very common for the liquid to be deposited on the closing body, for example due to air condensation in contact with the closing body or also due to infiltration and/or leakage.

In particular, if not removed in a short time, such deposit of liquid can affect the material of which the closing body is made, thus compromising the integrity thereof and accelerating the deformation processes described above.

DESCRIPTION OF THE INVENTION

The main aim of the present invention is to devise a battery charger for electric or hybrid motor vehicles that allows providing greater protection of the electronic appliance than the protection provided by known battery chargers.

Another object of the present invention is to devise a particularly light battery charger for electric or hybrid motor vehicles.

A further object of the present invention is to devise a battery charger for electric or hybrid motor vehicles that allows removing any liquids that may deposit thereon.

An additional object of the present invention is to devise a battery charger for electric or hybrid motor vehicles that allows overcoming the aforementioned drawbacks of the prior art in a simple, rational, easy, effective to use and low cost solution.

The above mentioned objects are achieved by the present battery charger for electric or hybrid motor vehicles having the characteristics of claim 1.

BRIEF DESCRIPTION OF THE DRAWINGS

Other characteristics and advantages of the present invention will be more evident from the description of a preferred, but not exclusive, embodiment of a battery charger for electric or hybrid motor vehicles, illustrated by way of an indicative, but not limited example, in the attached tables of drawings wherein.

EMBODIMENTS OF THE INVENTION

Figure 1:
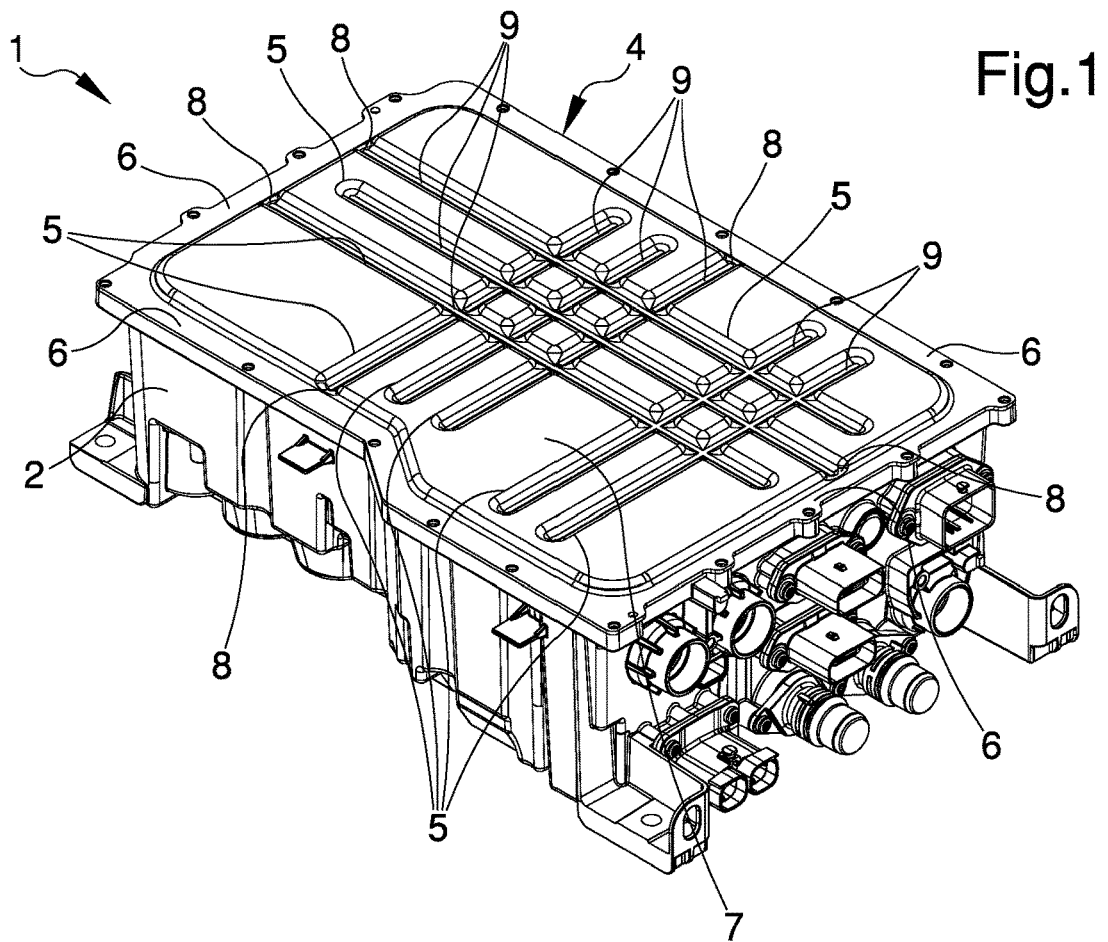
FIG. 1 is an axonometric view of the battery charger according to the invention.

With particular reference to these figures, reference numeral 1 globally indicates a battery charger for electric or hybrid motor vehicles.

In particular, the battery charger 1 for electric or hybrid motor vehicles comprises:
- at least one container body 2 installable on a motor vehicle and defining at least one housing compartment;
- at least one electronic appliance housed inside the housing compartment, connectable to at least one electric battery of the motor vehicle and configured to recharge the battery;

at least one closing body 4 of the container body 2 associated in a removable manner with the latter to close the housing compartment.

Appropriately, the closing body 4 is adapted to protect the electronic appliance housed inside the housing compartment.

Preferably, the container body 2 has a plurality of side walls adjacent to one another and a bottom wall that delimits the housing compartment together with the side walls.

In the particular embodiment shown in the illustrations, the container body 2 comprises four side walls of substantially flat shape and a bottom wall of substantially flat shape to define a container body 2 of substantially rectangular shape.

Alternative embodiments of the battery charger 1 cannot however be ruled out, wherein the container body 2 comprises a different number of side walls so as to form a container body 2 of a different shape, e.g. square.

Advantageously, the battery charger 1 comprises removable association means of the closing body 4 with the container body 2.

Preferably, the association means are of known type, such as e.g. a screw and nut securing system.

Specifically, the closing body 4 is substantially plate-shaped.

This way, the closing body 4 allows sealing the housing compartment and protecting the appliance, thus minimizing the size and weight of the battery charger 1.

Advantageously, the closing body 4 comprises reinforcing means which are shaped and arranged so as to prevent the closing body itself from being deformed.

In particular, the reinforcing means comprise at least one reinforcing element 5 made on at least one portion of the closing body 4.

With reference to the embodiment shown in the illustrations, the reinforcing means comprise a plurality of reinforcing elements 5 made on at least one portion of the closing body 4.

In addition, the reinforcing element 5 is of rectilinear shape.

Alternative embodiments of reinforcing means cannot however be ruled out in which the reinforcing element 5 has a different shape, e.g. a curved shape.

Advantageously, at least one of the reinforcing elements 5 is arranged substantially parallel to another of the reinforcing elements 5.

Furthermore, at least one of the reinforcing elements 5 is arranged substantially transverse to another of the reinforcing elements 5.

Figure 2:
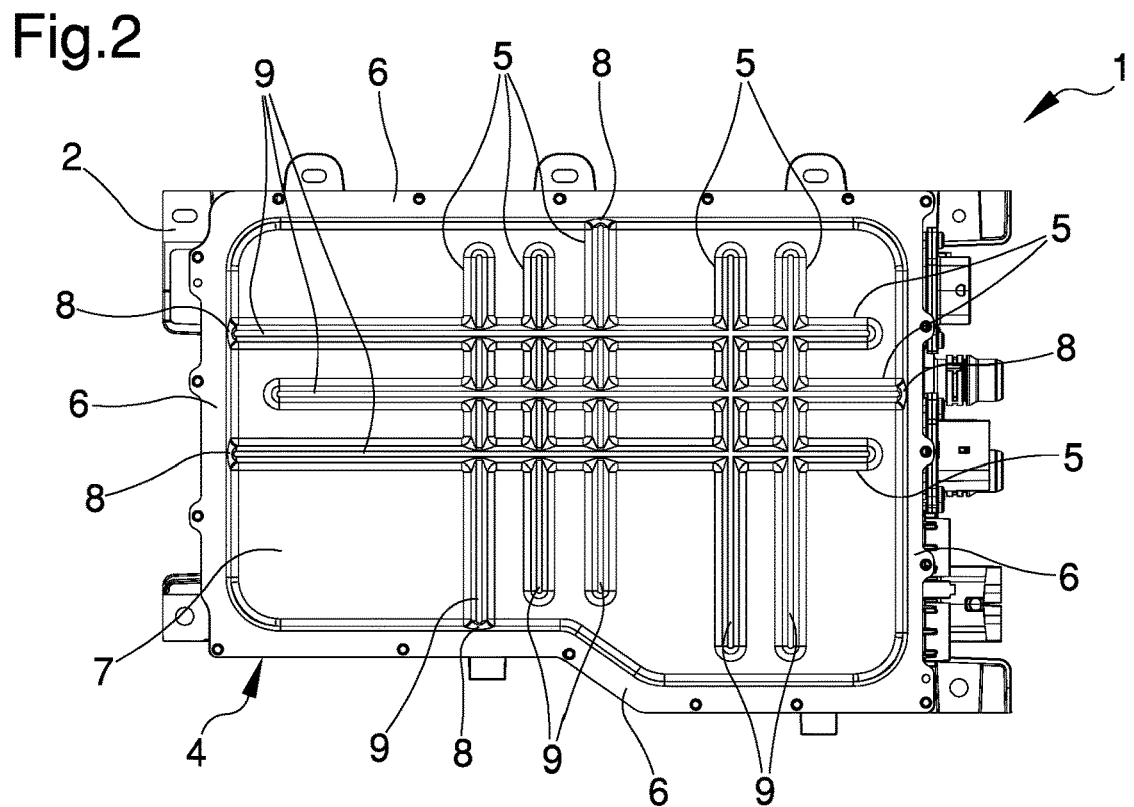
FIG. 2 is a top view of the battery charger according to the invention.

In detail, according to the embodiment shown in the illustrations, the battery charger 1 comprises eight reinforcing elements 5, three of which extend parallel to one another along a first direction of extension, and five others extend parallel to one another along a second direction of extension substantially orthogonal to the first direction of extension, as shown in FIG. 2.

Alternative embodiments of the battery charger 1 cannot however be ruled out, wherein the reinforcing means comprise a different number of reinforcing elements 5 arranged according to different combinations of reinforcing elements which are parallel, transverse and/or orthogonal to one another, so as to adapt to the shape of the closing body 4.

This way, the reinforcing elements 5 make a reinforcing net that extends substantially over the entire extension of the closing body 4, thus reinforcing the structure thereof at each point in a substantially even manner.

In particular, the reinforcing elements 5 distributed in this way give the closing body 4 special resistance to deformation and special durability, thus reducing the risk of compromising the protection of the electronic appliance.

Conveniently, the reinforcing means comprise drainage means of at least one liquid.

In particular, the closing body 4 comprises a plurality of perimeter sides 6 delimiting an outer surface 7 to the housing compartment and the drainage means comprise at least one drainage channel 9 made on the outer surface 7 and provided with at least one discharge outlet 8 arranged at one of the perimeter sides 6.

Advantageously, the drainage channel 9 is able to drain most of the liquids that can be deposited on the outer surface 7 of the closing body 4, in particular such as the liquid resulting from the condensation of air in contact with the closing body 4 or also as the liquids resulting from leaks and/or infiltrations.

Advantageously, the drainage channel 9 collects the liquid that is deposited on the outer surface 7 and conveys it outside the closing body 4, i.e. it conveys the collected liquid to the discharge outlet 8, through which the liquid itself leaves the closing body 4.

In more detail, the drainage means comprise a plurality of drainage channels 9 with at least one discharge outlet 8 arranged at each of the perimeter sides 6.

Preferably, each drainage channel 9 crosses the outer surface 7 extending substantially between two of its perimeter sides 6 arranged substantially opposite to one another.

In other words, each drainage channel 9 is provided with a terminal portion arranged in the proximity of a perimeter side 6 substantially opposed to the perimeter side 6 at which the discharge outlet 8 is placed.

Furthermore, at least one of the drainage channels 9 is connected in a fluid operated manner to at least another of the drainage channels 9 and is arranged substantially transverse to the latter.

In other words, each drainage channel 9 communicates with at least another drainage channel 9 with which it crosses, so that the collected liquid can easily pass from one drainage channel 9 to another.

In particular, according to the embodiment shown in the illustrations, the drainage channels 9 cross one another in a plurality of points.

This way, the drainage channels 9 make an interconnected collection network which substantially covers the entire outer surface 7 and which is provided with a plurality of discharge outlets 8 accessible from any drainage channel 9.

In fact, this collection network allows the liquid to be removed to reach a discharge outlet 8 even in the event of changes in the position of the battery charger 1, such as e.g. changes in the inclination of the closing body 4, and consequently of the outer surface 7, caused by the operation of the motor vehicle.

Advantageously, according to the embodiment shown in the illustrations, the reinforcing element 5 coincides with the drainage channel 9.

In particular, the reinforcing element 5 comprises at least one cross section of concave shape and defining the drainage channel 9.

In more detail, at least one of the reinforcing elements 5 and the drainage channel 9 is made on the outer surface 7 by means of a molding process of the closing body 4.

Advantageously, the reinforcing element 5 and the drainage channel 9 are made by means of a single molding process which allows making the cross section of the reinforcing elements.

Preferably, this process is performed to make the closing body 4.

It has in practice been ascertained that the described invention achieves the intended objects.

In particular, the conformation and arrangement of the reinforcing elements make it possible to make a reinforcing net evenly distributed over the entire closing element, giving it particular resistance to deformation and greater durability over time.

In addition, the presence of the drainage means makes it possible to effectively and efficiently remove the liquids that may deposit on the outer surface and that over time, if not removed, may compromise the integrity of the materials of which the closing body is made.

In addition, the manufacturing of the reinforcing elements using the molding process makes it possible to strengthen the structure of the closing body and at the same time not to weigh down the battery charger.

In detail, the particular conformation of the reinforcing elements allows making the same and the drainage channels with a single molding process of the closing body.

In fact, this particular conformation causes the reinforcing elements to substantially coincide with the drainage channels.

The invention claimed is:

1. A battery charger for electric or hybrid motor vehicles, the battery charger comprising:
    at least one container body installable on a motor vehicle and defining at least one housing compartment;
    at least one electronic appliance housed inside said housing compartment, connectable to at least one electric battery of said motor vehicle and configured to recharge said battery; and
    at least one closing body of said container body associated in a removable manner with the latter to close said housing compartment, said closing body being adapted to protect said electronic appliance housed inside said housing compartment;
    wherein said closing body comprises reinforcing means which are shaped and arranged so as to prevent the deformation of the closing body itself, wherein
    said reinforcing means comprise at least one reinforcing element made on at least one portion of said closing body,
    said reinforcing element is of rectilinear shape,
    said reinforcing means comprise a plurality of reinforcing elements made on at least one portion of said closing body,
    at least one of said reinforcing elements is arranged substantially parallel to another of said reinforcing elements, and
    at least one of said reinforcing elements is arranged substantially transverse to another of said reinforcing elements.

2. The battery charger according to claim 1, wherein said closing body is substantially plate-shaped.

3. The battery charger according to claim 1, wherein said reinforcing means comprise drainage means of at least one liquid.

4. The battery charger according to claim 3, wherein said closing body comprises a plurality of perimeter sides delimiting an outer surface to said housing compartment and by the fact that said drainage means comprise at least one drainage channel made on said outer surface and provided with at least one discharge outlet arranged at one of said perimeter sides.

5. The battery charger according to claim 4, wherein said drainage means comprise a plurality of drainage channels with at least one discharge outlet arranged at each of said perimeter sides.

6. The battery charger according to claim 5, wherein at least one of said drainage channels is connected in a fluid operated manner to at least another of said drainage channels and is arranged substantially transverse to the latter.

7. The battery charger according to claim 4, wherein said reinforcing means comprise at least one reinforcing element made on at least one portion of said closing body, and wherein said reinforcing element coincides with said drainage channel.

8. The battery charger according to claim 7, wherein said reinforcing element comprises at least one cross section of concave shape and defining said drainage channel.

9. The battery charger according to claim 7, wherein at least one of said reinforcing element and said drainage channel is made on said outer surface by means of a molding process of said closing body.

\* \* \* \* \*